(12) United States Patent
Czornomaz et al.

(10) Patent No.: US 9,513,436 B2
(45) Date of Patent: Dec. 6, 2016

(54) SEMICONDUCTOR DEVICE

(71) Applicant: International Business Machines Corporation, Armonk, NY (US)

(72) Inventors: Lukas Czornomaz, Rueschlikon (CH); Jens Hofrichter, Rueschlikon (CH); Mirja Richter, Kilchberg (CH); Heike Riel, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/439,942

(22) PCT Filed: Oct. 31, 2013

(86) PCT No.: PCT/IB2013/059814
§ 371 (c)(1),
(2) Date: Apr. 30, 2015

(87) PCT Pub. No.: WO2014/068511
PCT Pub. Date: May 8, 2014

(65) Prior Publication Data
US 2015/0293302 A1    Oct. 15, 2015

(30) Foreign Application Priority Data

Oct. 31, 2012    (GB) .................................. 1219595.4

(51) Int. Cl.
*G02B 6/12*    (2006.01)
*G02B 6/43*    (2006.01)
(Continued)

(52) U.S. Cl.
CPC .......... *G02B 6/12004* (2013.01); *G02B 6/131* (2013.01); *G02B 6/43* (2013.01); *H01L 31/02327* (2013.01);
(Continued)

(58) Field of Classification Search
None
See application file for complete search history.

(56) References Cited

U.S. PATENT DOCUMENTS

| 6,936,839 B2 | 8/2005 | Taylor |
| 7,418,166 B1 | 8/2008 | Kapur et al. |

(Continued)

FOREIGN PATENT DOCUMENTS

| CN | 101021593 A | 8/2007 |
| WO | WO2007/055739 A1 | 5/2007 |
| WO | WO2009/115859 A1 | 9/2009 |

OTHER PUBLICATIONS

International Search Report PCT/IB2013/059814.
Examination Report dated May 17, 2016 received from the United Kingdom Patent Office in GB1506501.4.

*Primary Examiner* — Jerry Rahll
(74) *Attorney, Agent, or Firm* — Scully, Scott, Murphy & Presser, P.C.; David M. Quinn, Esq.

(57) ABSTRACT

The present invention relates to a semiconductor device (1) for use in at least an optical application comprising: at least an optically passive aspect (2) that is operable in substantially an optically passive mode, and at least an optically active material (3) comprising at least a material that is operable in substantially an optically active mode, wherein: the optically passive aspect (2) further comprises at least a crystalline seed layer (4), the optically active material (3) being epitaxially grown in at least a predefined structure (5) provided in the optically passive aspect (2) that extends to at least an upper surface (4') of the crystalline seed layer (4), and the optically passive aspect (2) is structured to comprise at least a passive photonic structure (6), wherein the crystalline seed layer (4) comprises a crystalline wafer and wherein the optically active material (3) comprises at least one of: a III-V material and a II-VI material.

30 Claims, 7 Drawing Sheets

(51) Int. Cl.
*H01L 31/0232* (2014.01)
*H01S 5/026* (2006.01)
*G02B 6/13* (2006.01)
 H01S 5/00  (2006.01)
 G02B 6/42  (2006.01)
 G02B 6/122 (2006.01)
 H01S 5/10  (2006.01)
 H01S 5/183 (2006.01)

(52) U.S. Cl.
CPC .............. *H01S 5/026* (2013.01); *G02B 6/122* (2013.01); *G02B 6/1225* (2013.01); *G02B 6/42* (2013.01); *H01S 5/005* (2013.01); *H01S 5/105* (2013.01); *H01S 5/183* (2013.01)

(56) References Cited

U.S. PATENT DOCUMENTS

| | | |
|---|---|---|
| 7,603,016 B1 | 10/2009 | Soref |
| 8,299,485 B2 | 10/2012 | Celler |
| 2007/0104441 A1 | 5/2007 | Ahn et al. |
| 2010/0295083 A1 | 11/2010 | Celler |
| 2012/0219250 A1 | 8/2012 | Ren et al. |

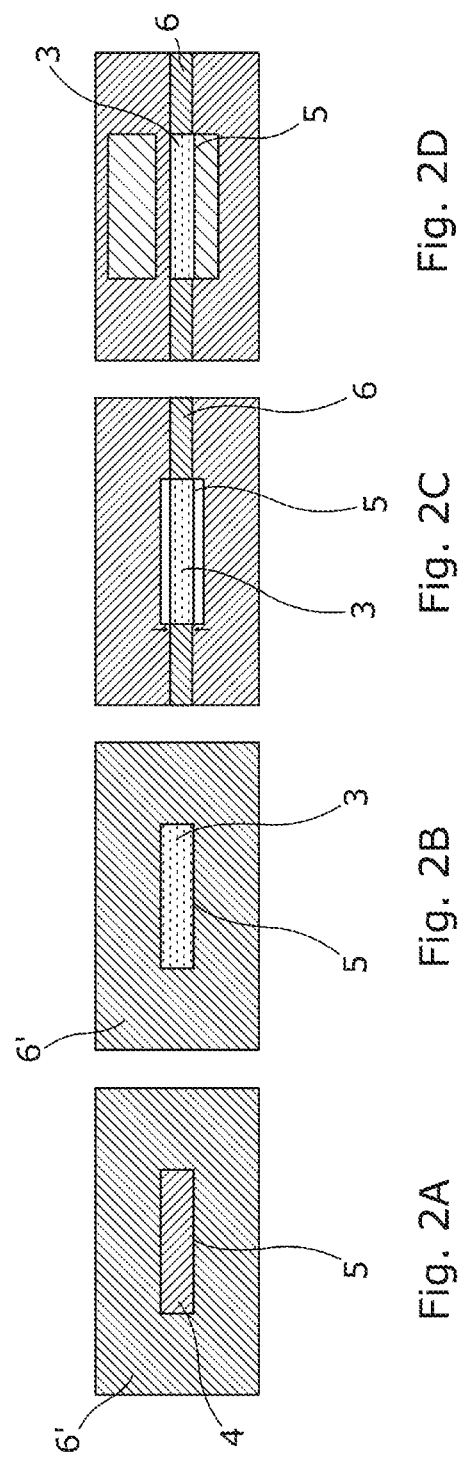

SEMICONDUCTOR DEVICE

CROSS-REFERENCE TO RELATED APPLICATIONS

This application is based on and claims the benefit of priority of the filing date of commonly-owned, co-pending on PCT Application No. PCT/IB2013/059814 filed Oct. 31, 2013, which further claims the benefit of priority from commonly-owned Great Britain Patent Application 1219595.4, filed on Oct. 31, 2012.

FIELD OF THE INVENTION

The present invention relates to a semiconductor device for use in an optical application and a method of fabrication therefor.

BACKGROUND OF THE INVENTION

In order to meet the requirements of future computing systems, higher speed and more energy efficient alternatives to electrical interconnects such as, for example, on-chip optical interconnects and chip-to-chip optical interconnects, may be needed. Integrated optics, particularly silicon photonics, may suitably meet such needs. For the cost-effective, mass-fabrication of complementary metal-oxide semiconductor (CMOS)-based chips having a performance capability suitable for use in high-speed devices and/or applications, integrated optical interconnects with compatible light sources are to be provided. A problem in this regard is that, due to the indirect band-gap of silicon, no silicon-based light sources are available and/or may be used. This problem has been addressed by the use of III-V based semiconductor material systems typically being used as light sources in conjunction with silicon photonics and, more generally, integrated optics based on a silicon platform. However, an associated problem in this regard is posed by the lattice mismatch between III-V compound semiconductors and silicon, making the direct, monolithic integration of III-V based light sources on a silicon platform non-trivial. In previously-proposed approaches for facilitating such integration, bonded III-V based, pre-processed light sources or blanket gain materials have been used. In this regard, it may be time-consuming and challenging to achieve relatively high-precision alignment when bonding a pre-processed III-V based light source to a given waveguide structure, particularly since the alignment precision may be further limited by the bonding process. For bonding a blanket III-V material on a pre-processed silicon-based waveguide, the alignment marks located on the silicon wafer that are provided for the lithography step involved in the patterning of the III-V layer may be used. Because the alignment accuracy of light sources based on compound semiconductor systems, such as, for example, III-V materials, with respect to optical structures, such as, for example, silicon waveguides and/or resonators, may be rather dependent on lithography accuracy, it may be insufficient for certain applications. Generally, the positioning accuracy of such heterogeneously/hybrid integrated optical systems is inherently lower compared to monolithic integration. Furthermore, concerning yield, heterogeneous/hybrid integration may not match the standards provided by integrated electronics. In this regard, and typically, yield features are in the 90% range for single devices, for example.

A further problem to be considered for heterogeneous/hybrid optical systems, particularly for III-V based light sources used with silicon photonics, is concerned with how the generated light is located in such systems. In this regard, it may be that the light is located mainly in the silicon with a relatively smaller overlap with the III-V material system, which may result in a relatively low material gain and high threshold currents. Or, it could be that the light is located mainly in the III-V material system in which case there is a relatively good overlap with the gain sections but also the possibility of lossy resonators that may contribute to relatively lower optical output power.

Previously-proposed devices/systems fabricated using hybrid/no integration on a silicon platform have been described in the following documents: "Electrically pumped hybrid AlGaInAs-silicon evanescent laser", by Fang et al., published in Optics Express, vol. 14, issue 20, pp. 9203-9210, 2006; "Electrically pumped InP-based microdisk lasers integrated with a nanophotonic silicon-on-insulator waveguide circuit", by Van Campenhout et al., published in Optics Express, vol. 15, issue 11, pp. 6744-6749, 2007; "Metamorphic DBR and tunnel-junction injection: A CW RT monolithic long-wavelength VCSEL", by Boucart et al., published in IEEE J. Sel. Topics Quantum Electron, vol. 5, issue 3, pp. 520-529, 1999, and "Pseudomorphic and metamorphic quantum dot heterostructures for long-wavelength lasers on GaAs and Si", by Mi et al. published in IEEE Journal of selected topics in quantum electronics, vol. 14, no. 4, pp. 1171-1179, 2008.

In the document titled, "III-V/Si photonics by die to wafer bonding", by Roelkens et al. published in Materials Today, vol. 10, issues 7-8, pp. 36-43, 2007, the bonding of a III-V layer to a silicon wafer using a polymer adhesive is described.

This document does not seem to contain any teaching on optical properties and/or functionalities as per an optical device/system suitable for use in a given optical application that may address/provide a solution to the problems associated with previously-proposed optical devices/systems as above-described with reference to hybrid/heterogeneous integrated optical systems.

Reference is now made to the document titled, "III-V semiconductor-on-insulator n-channel metal-insulator-semiconductor field-effect transistors with buried $Al_2O_3$ layers and sulphur passivation: Reduction in carrier scattering at the bottom interface", by Yokoyama et al. published in Appl. Phys. Lett., vol. 96, 142106, 2010, in which the fabrication of a III-V transistor on silicon by bonding a seed-layer and performing successive growth is described. This document does not seem to contain any teaching on optical properties and/or functionalities as per an optical device/system suitable for use in a given optical application that may address/provide a solution to the problems associated with previously-proposed optical devices/systems as above-described with reference to hybrid/heterogeneous integrated optical systems.

In the document titled, "Defect reduction of GaAs epitaxy on Si (001) using selective aspect ratio trapping", by Li et al. published in Appl. Phys. Lett., vol. 91, 021114, 2007, in which III-V epitaxy in oxide trenches on silicon has been reported using aspect ratio trapping. Reference is also made to the document titled, "Monolithic integration of GaAs/InGaAs lasers on virtual Ge substrates via aspect-ratio trapping", by Li et al. published in J. Electrochem. Soc. 156, H574, 2009, in which the formation of GaAs/InGaAs quantum well lasers, by metalorganic chemical vapour deposition, on virtual Ge substrates on silicon has been demonstrated via aspect ratio trapping and epitaxial lateral overgrowth. These documents are respectively concerned with addressing known problems associated with the fabrication of structures comprising compound semiconductor material systems, such as III-V material systems, on silicon, which may cause performance deterioration of devices in which such structures are integrated. Such problems are related to the lattice mismatch and difference in thermal coefficients between III/V material systems and silicon. However, neither of these documents address the problems, as discussed hereinabove, with respect to hybrid/heterogeneous integrated optical systems and/or the monolithic integration and optical coupling of light sources with optical structures such as waveguides and, more generally, photonic structures.

The epitaxial growth of III-V materials directly on a silicon platform and/or light-emitting devices and photodetectors based on nanowires have been reported in the following documents: "Si—InAs heterojunction Esaki tunnel diodes with high current densities", by Bjoerk et al., published in Appl. Phys. Lett., vol. 97, 163501, 2010; "Nanolasers grown on silicon" by Chen et al., published in Nature Photonics, vol. 5, pp. 170-175, 2011, and "GaAs based nanoneedle light-emitting diode and avalanche photodiode monolithically integrated on a silicon substrate" by Chuang et al., published in Nano Letters, vol. 11, pp. 385-390, 2011. These documents do not seem to address the monolithic integration of III-V based light sources on a silicon platform. Furthermore, they do not address/propose any solution/alternative to the problems and/or issues associated with hybrid/heterogeneous integrated optical systems.

Reference is now made to the document titled, "Hybrid III-V semiconductor/silicon nanolaser", by Halioua et al., published in Optics Express, vol. 19, 9221, 2011, in which an optically pumped one-dimensional photonic cavity laser is vertically coupled to a pre-structured straight silicon waveguide. Alignment of the laser with respect to the silicon waveguide is performed by electron-beam lithography using markers formed in the silicon waveguide, with an overlay accuracy of better than 50 nm potentially being achieved. This document does not disclose any electrical pumping and/or lateral coupling of the light source with the passive optical components/aspects. Furthermore, this document does not seem to provide instruction on how to address the problems/issues associated with hybrid/heterogeneous integrated optical systems as hereinbefore described.

In the document titled, "Design and optical characterisation of photonic crystal lasers with organic gain material", published by Baumann et al. in Journal of Optics, vol. 12, 065003, 2010, spin-coating of an organic gain material onto a two-dimensional photonic crystal is reported. Whilst suitable for organic gain material, spin-coating is not compatible with respect to solid state gain materials, such as, for example, III-V material systems. Furthermore, this document does not disclose any electrical pumping.

Turning to the document titled, "Ultra-high quality-factor resonators with perfect azimuthal modal-symmetry", published by Moll et al. in Optics Express, vol. 17, 20998, 2009, a circular grating and the use of the disclosed devices as modulators is described. No teaching is provided on electrical pumping or the integration of III-V material systems with silicon.

US 2008/0128713 A1 discloses a light-emitting device including a first electrode unit for injecting an electron, a second electrode unit for injecting a hole, and light-emitting units electrically connected to the first electrode unit and the second electrode unit, respectively, wherein the light-emitting units are formed of single-crystal silicon, the light-emitting units having a first surface (topside surface) and a second surface (underside surface) opposed to the first surface, plane orientation of the first and second surfaces being set to a (100) plane, thicknesses of the light-emitting units in a direction orthogonal to the first and second surfaces being made extremely thin. This document describes the fabrication and use of a silicon light source and a silicon laser. The process by way of which light is generated seems to be based on impact ionisation rather than on a direct band-gap transition. Furthermore, neither the use of III-V materials for the optically active aspect nor the integration and/or use thereof with silicon seem to be disclosed in this document. Operation at <1200 nm seems to be described which may make the disclosed device unattractive for light propagation using silicon waveguides, for example. Also, this document does not seem to provide instruction on how to address the problems/issues associated with hybrid/heterogeneous integrated optical systems as hereinbefore described.

US 2008/0002929A1 describes an apparatus and a method for electrically pumping a hybrid evanescent laser. For one example, the apparatus includes an optical waveguide disposed in silicon. An active semiconductor material is disposed over the optical waveguide defining an evanescent coupling interface between the optical waveguide and the active semiconductor material such that an optical mode to be guided by the optical waveguide overlaps both the optical waveguide and the active semiconductor material. A current injection path is defined through the active semiconductor material and at least partially overlapping the optical mode such that light is generated in response to electrical pumping of the active semiconductor material in response to current injection along the current injection path at least partially overlapping the optical mode. In this document, the light generated by the active semiconductor material is evanescently coupled to a silicon waveguide that constitutes a passive aspect. The presented approach for facilitating a light source on silicon is based on hybrid/heterogeneous integration rather than directly by monolithic integration. Because the active semiconductor material is remotely positioned with respect to the silicon waveguide, it may be that the position of the generated light relative to passive aspect is relatively unchanged. Also, it may be that the overlap of the generated light with the active semiconductor material is relatively small, which is concurrent with a hybrid mode of operation, that is, a mainly passive mode with a relatively smaller active mode. Such a hybrid mode of operation may cause relatively higher threshold currents and lower optical output levels.

US 2008/0198888 A1 discloses a method of bonding a compound semiconductor on a silicon waveguide for attaining a laser above a silicon substrate. This document is concerned with the heterogeneous integration, rather than the monolithic integration, of a light source based on a compound semiconductor material system with respect to a silicon substrate.

US2009/0245298A1 discloses a silicon laser intermixed integrated device, comprising: a silicon-on-insulator substrate comprising at least one waveguide in a top surface, and a compound semiconductor substrate comprising a gain layer, the compound semiconductor substrate being subjected to a quantum well intermixing process, wherein the upper surface of the compound semiconductor substrate is bonded to the top surface of the silicon-on-insulator substrate. This document is concerned with the hybrid/heterogeneous integration, rather than the monolithic integration, of a surface of a compound semiconductor substrate with respect to a silicon-on-insulator substrate. Based on the index contrasts of the fabricated structures, it may be that the light generated by the laser source/compound semiconductor aspect is mainly confined in the silicon with a relatively small proportion being confined within the compound semiconductor, which may serve to limit the efficiency of the laser and result in relatively increased power consumption.

U.S. Pat. No. 5,703,896 discloses an apparatus for emitting varying colours of light comprising: a lasing layer formed of crystalline silicon quantum dots formed in an isolation matrix of hydrogenated silicon; said quantum dots being formed in three patches; each of said three patches having different sized quantum dots therein to thereby produce three different colours of light; a barrier layer of p-type semiconductor under said lasing layer, said p-type semiconductor being selected from the group GaP, SiC, GaN, ZnS; a substrate member under said barrier layer; an n-type semiconductor layer above said lasing layer, said n-type semiconductor layer being selected from the group GaP, SiC, GaN, ZnS; a positive potential contact beneath said substrate member, three negative potential contacts; each of said three contacts being above a different one of said three patches; each of said three contacts acting with said positive contact to selectively bias a different one of said three patches; three sectors of concentric grating surrounding said three patches; each of said sectors having a radial period corresponding to the colour of light produced by an adjacent one of said three patches; and each of said sectors resonating photons emitted by said adjacent patch to stimulate coherent light emission. This document is concerned with the fabrication of silicon quantum dots in silicon. It does not address the monolithic integration of a light/laser source based on a compound semiconductor such as, a III-V material system, with respect to an optical structure such as, a photonic structure and/or optical waveguide based on a silicon platform.

US2007/0105251 discloses a laser structure comprising: at least one active layer including doped Ge so as to produce light emissions at approximately 1550 nm from the direct band-gap of Ge; a first confinement structure being positioned on a top region of said at least one active layer; and a second confinement structure being positioned on a bottom region of said at least one active layer. This document describes the fabrication and the use of a laser on a silicon platform. The gain medium seems to be based on trained and doped germanium, which mimics a direct band-gap material, rather than a compound semiconductor material system such as a III-V material system, for example. Certain cavity designs, such as vertical cavity self-emitting lasers (VCSELs) are contemplated in the discussed disclosure. This document does not seem to provide instruction on how to address the problems/issues associated with hybrid/heterogeneous integrated optical systems as hereinbefore described.

US2007/0104441 discloses an integrated photodetector apparatus comprising: (a) a substrate comprising a first cladding layer disposed over a base layer, the base layer comprising a first semiconducting material, the first cladding layer defining an opening extending to the base layer; (b) an optical waveguide comprising the first semiconductor material and disposed over the substrate; and (c) a photodetector comprising a second semiconductor material epitaxially grown over the base layer at least in the opening, the photodetector comprising an intrinsic region optically coupled to the waveguide, at least a portion of the intrinsic region extending above the first cladding layer and laterally aligned with the waveguide. The disclosed fabrication method is in relation to a germanium photodetector that is laterally coupled to a polycrystalline waveguide and is aligned relative thereto by way of a dedicated, multiple-step alignment procedure. This document does not address how a compound semiconductor based light source may be monolithically integrated with respect to integrated optics based on a silicon platform.

US2010/0295083A1 discloses a multilayer structure containing a silicon layer that contains at least one waveguide, an insulating layer and a layer that is lattice compatible with Group III-V compounds, with the lattice compatible layer in contact with one face of the insulating layer, and the face of the insulating layer opposite the lattice compatible layer is in contact with the silicon layer. The silicon and the insulating layers contain either or both of at least one continuous cavity filled with materials such as to constitute the photodetector zone, or at least one continuous cavity filled with materials such as to constitute a light source zone. A multilayer wafer structure is disclosed in this document comprising in descending order: a surface silicon layer, a silicon dioxide layer, a lattice compatible layer, a buried oxide layer and a silicon base. The surface silicon core layer is structured to comprise a waveguide structure and the silicon dioxide layer comprises a cladding layer. The surface silicon layer and the silicon dioxide layer are structured to comprise a cavity that extends to an upper surface of the lattice compatible layer. The cavity is filled with materials thereby to facilitate an optically active aspect comprising a light source zone and/or a photodetector zone. The lattice compatible layer acts as a template for growth of the light source zone and the photodetector zone and it most preferably comprises germanium. With respect to the lattice compatible layer comprising germanium and as acknowledged in this document: the growth of high-quality epitaxial germanium on silicon is non-trivial due to the misfit dislocations that form due to the lattice mismatch, and that subsequent/any processing steps should be conducted so as to avoid inducing damage in the germanium surface or removing such damage afterwards, since the homoepitaxy/heteroepitaxy on germanium requires a good crystalline template. Furthermore, the lattice compatible layer has to be bonded to the upper silicon dioxide layer, which may increase the number of processing steps and/or complexity in the fabrication of the device disclosed in this document. Also, this document provides the instruction that: incorporation of any electronic circuits and waveguides in the silicon layer is done prior to the preparation of the light source and the photodetector zones since optically active materials such as III-V compounds risk contaminating and damaging the silicon device fabrication process, and that the processing steps for the incorporation of such electronic circuits and/or the waveguiding structures should not exceed the melting point of the material that is used for the lattice compatible layer.

Accordingly, it is a challenge to provide a semiconductor device for use in any given optical application that provides an improved performance, particularly in respect of lower threshold currents and/or higher optical output power, over previously-proposed optical systems, for example, those based on heterogeneous/hybrid integrated optical systems as above-discussed. It is also a challenge that, in respect of such a semiconductor device, an optically active aspect based on a compound material system, such as, for example, a III-V material system, is directly and monolithically integrated on an integrated optical platform based on silicon, for example.

SUMMARY OF THE INVENTION

According to an embodiment of a first aspect of the invention there is provided a semiconductor device for use in at least an optical application comprising: at least an optically passive aspect that is operable in substantially an optically passive mode, and at least an optically active material comprising at least a material that is operable in substantially an optically active mode, wherein the optically passive aspect further comprising at least a crystalline seed layer, the optically active material being epitaxially grown in at least a predefined structure provided in the optically passive aspect that extends to at least an upper surface of the crystalline seed layer, and the optically passive aspect is structured to comprise at least a passive photonic structure. The crystalline seed layer comprises a crystalline wafer or consists of a crystalline wafer. The optically active material comprises or consists of at least one of: a III-V material and a II-VI material.

According to an embodiment the optically passive aspect is structured to comprise the passive photonic structure subsequent to the growth of the optically active material in the predefined structure.

In an embodiment of the present invention, the optically active material forming the basis of the light/laser source is grown in a predefined structure that is provided within the optically passive aspect. The light that is generated by the optically active material is optically coupled to the photonic structure of the optically passive aspect and is transmitted and/or guided to a desired location. Since the optically active material is grown within the optically passive aspect having a selected material and/or layer configuration, a much-improved overlap of the generated light in the gain medium and the light transmission/guiding material(s) and/or features thereof may be obtained. Thus, higher material gain and, therefore, an improved modal gain may be obtained with an embodiment of the present invention compared to previously-proposed devices. Due to the improved modal gain, lower threshold currents and an improved optical performance of the light/laser source implemented by way of the optically active material may be facilitated in an embodiment of the present invention. A further advantageous feature of an embodiment of the present invention is ease of implementation since the predefined structure is provided as extending up to at least an upper surface of the crystalline seed layer, which provides a crystalline template for growth of the optically active material. The provision of the predefined structure is, therefore, done without the need for corresponding bonding and/or alignment processes. The optically passive aspect may also be denoted as an optically passive region of the semiconductor device.

According to an embodiment the predefined structure extends into the crystalline wafer.

According to a further embodiment the aspect ratio of the predefined structure, that is, the ratio of its height to its width/diameter, is chosen to be greater than 1 and, more preferably, greater than 3.

Preferably, the predefined structure comprises a dielectric aperture formed with respect to the optically passive aspect, the optically passive aspect being structured after the growth of the optically active material in the predefined structure. In an embodiment of the present invention, the predefined structure is formed in the optically passive aspect. With respect to the outer sidewalls of the predefined structure, the optically passive aspect may comprise a multilayer structure in which each of the layers may comprise a respective dielectric material and where one of the layers has a lower refractive index than another of the layers. In an embodiment of the present invention, the structural characteristics and/or material composition of the dielectric aperture may be chosen thereby to support more efficient optical coupling of the light generated by the optically active material from the predefined structure to the photonic structure and reduced loss of the light transmitted/guided by the photonic structure to a desired location. In this way, a lower threshold current and higher optical output power may be facilitated, which extend the advantage of improved device performance to an embodiment of the present invention. In this regard, the dielectric aperture desirably comprises at least one of: silicon, germanium, gallium arsenide, gallium antimonide, gallium nitride, indium phosphide, indium aluminium arsenide, indium arsenic phosphide, indium gallium phosphide, gallium phosphide, indium gallium arsenide, indium gallium arsenic phosphide, aluminium oxide, tantalum pent-oxide, hafnium dioxide, titanium dioxide, silicon dioxide, silicon nitride and silicon oxi-nitride.

Preferably, the optically active material is implemented as a light emitting structure comprising one of at least: a laser, a light emitting diode, a super luminescent diode and a semiconductor amplifier. Since the optically active material may be implemented as a light-emitting structure in a number of different forms, this feature extends the advantages of versatility of application to an embodiment of the present invention.

Desirably, the predefined structure is a trench, a hole or a combination thereof. The predefined structure is a structural feature provided in respect of the optically passive aspect, and in an embodiment of the present invention is chosen to be a trench, a hole or a combination thereof. Since such features may be provided with relative ease and/or precision regarding location and/or structural characteristics, they extend to an embodiment of the present invention, the advantages of ease of implementation and versatility since the shapes and/or sizes thereof may be adapted to target specific devices, typically in the range of 10 nanometers to 10 micrometers.

Preferably, at least a structural characteristic of the predefined structure is chosen thereby to foster a desired epitaxial growth of the optically active material. The optically passive aspect is structured after the epitaxial growth of the optically active material in the predefined structure thereby to provide a desired optical coupling of the optically active material. By making an appropriate selection of one or more structural characteristics of the predefined structure such as a width, height and/or a shape thereof, the epitaxial growth and/or the optical coupling of the optically active material to the optically passive aspect may be further improved and/or provided to suit, for example, an application of an embodiment of the present invention. Furthermore, any lattice mismatch between the respective materials/material systems used for the optically active material and the optically passive aspect may be addressed by way of such a selection.

Desirably, the predefined structure is provided in a given location of the optically passive aspect. In respect of the optical coupling of the optically active material with the optically passive aspect, the optically active material is grown locally in the predefined structure rather than over the whole surface of the optically passive aspect. For example, the predefined structure may be formed in the optically passive aspect where the integration of the laser/light source, by way of the optically active material, is anticipated. This feature of an embodiment of the present invention may extend the advantages of ease of design, fabrication and implementation of an embodiment of the present invention since the optically active material is provided relative to the optically passive aspect as desired rather than being provided generally, the latter necessitating further processing steps for the removal of the optically active material from those regions other than the predefined structure.

According to embodiments the optically active material comprises at least one of: a III-V material system, a II-VI material system and heterostructures thereof comprising at least one of: gallium arsenide, gallium antimonide, gallium nitride, indium phosphide, indium phosphide, indium aluminium arsenide, indium arsenic phosphide, indium gallium phosphide, gallium phosphide, indium gallium arsenide and indium gallium arsenic phosphide. Desirably, the optically active material comprises a crystalline, polycrystalline or amorphous material. An embodiment of the present invention is not limited to the use of a specific material/material system for the optically active material and, in fact, different and a broad range of materials may be used therefor, which feature may provide the advantages of increased versatility in terms of devices and/or optical systems/applications in which an embodiment of the present invention may be used. Appropriate material stacks and/or quantum dots are encompassed within the scope of the present invention for the optically active material.

Preferably, the photonic structure comprises at least an optical waveguide. By way of this feature, light may be transmitted and/or coupled from the predefined structure to a desired location.

Desirably, the optically active material has an emission wavelength that is substantially matched with a transmission range of the photonic structure. This feature may facilitate improved and/or a desired optical coupling/light transmission in an embodiment of the present invention.

According to an embodiment the crystalline seed layer comprises a crystalline wafer. According to another embodiment the crystalline seed layer comprises a crystalline oxide layer. In an embodiment of the present invention, the crystalline seed layer provides a crystalline template for the growth of the optically active material the predefined structure and thereby extends the advantages of improved optical coupling and/or device performance to an embodiment of the present invention. Desirably, the crystalline seed layer comprises at least one of: silicon, germanium, silicon-germanium, III-V compound semiconductor, a crystalline oxide and strontium barium titanate. Advantages associated with the crystalline seed layer comprising a crystalline oxide layer include any combination of the following functions: being an insulating layer providing isolation from an underlying host substrate that may typically be provided in an embodiment of the present invention where the crystalline seed layer comprises a crystalline oxide layer, it may be used as a lower cladding layer with respect to the optically passive aspect being structured to comprise a waveguide structure, it may also serve as a tunable refractive index material. Furthermore, and in contrast to previously-proposed devices, the crystalline oxide layer need not be lattice compatible with the optically active material.

Preferably, an embodiment of the present invention comprises at least a vertical-cavity surface-emitting laser implemented by way of alternating layers of the optically active material. This feature comprises a coupling scheme for optically coupling the optically active material with the optically passive aspect by way of a vertical cavity feature. Specifically, a vertical cavity surface-emitting laser is proposed having alternating layers of optically active material that form the dielectric Bragg reflectors. An advantage of this feature may be that the coupling properties may be tuned as desired by variation of the mirror reflectivity, that is, by using more or fewer of the alternating layers of the optically active material or by changing the composition of the layer stacks of the optically active material. A further advantage of this feature may be ease of integration/implementation of an embodiment of the present invention in optical systems/applications where space economy in a lateral plane is desired. In this regard, and desirably, at least an emission region of the vertical-cavity surface-emitting laser is positioned relative to the optically passive aspect such that light generated by the vertical-cavity surface-emitting laser is coupled substantially in at least one of: a vertical plane relative to a surface of the optically passive aspect and laterally in an in-plane direction of the optically passive aspect. By way of this feature, light may be coupled from the vertical-cavity surface emitting laser in a desired plane or planes relative to the optically passive aspect and, thus, may extend the advantage of broadening a range of applications/optical systems in which an embodiment of the present invention may be used.

Preferably, and in relation to a first coupling scheme with a lateral cavity feature in an embodiment of the present invention, light generated by the optically active material is optically coupled into the photonic structure by butt coupling. Advantages associated with this feature of an embodiment of the present invention include: ease of optically coupling light substantially laterally from the optically active material to the photonic structure, ease of fabrication and/or integration particularly when the photonic structure comprises silicon since such structures may be fabricated with well-established complementary metal-oxide semiconductor (CMOS) processes. Desirably, in an embodiment of the present invention, the photonic structure comprises a wire cavity implemented as a dielectric Bragg reflector, which feature in addition to the above-described advantages stated in respect of butt-coupling, provides the further advantage of facilitating a laser source and stimulated emission.

Preferably, and in relation to a second coupling scheme with a lateral cavity feature, an embodiment of the present invention comprises at least a one-dimensional photonic crystal cavity in which periodic holes are formed in an in-plane direction of the photonic structure and in a region thereof where light generated by the optically active material is substantially optically coupled to the photonic structure. Because a modal volume and/or the quality factor of a lateral cavity implemented as a one-dimensional photonic crystal cavity may be better controlled, corresponding advantages are extended, by way of the afore-described feature, to an embodiment of the present invention. In this regard, a hole-size of the periodic holes is desirably tapered to progressively increase in at least a direction towards the photonic structure. The progressively tapered holes extend the advantages of mode-shaping of the cavity mode and higher quality-factor values as well as an improved quality-factor-to-modal-volume ratio to an embodiment of the present invention.

Preferably, and in relation to a third coupling scheme with a lateral cavity feature, an embodiment of the present invention comprises at least a two-dimensional photonic crystal cavity in which periodic holes are formed in two in-plane directions of the photonic structure. Even better control of a modal volume, the quality factor and/or improved quality-factor-to-modal-volume ratio in both in-plane directions may be achieved with a lateral cavity implemented as a two-dimensional photonic crystal cavity and so corresponding advantages are extended to an embodiment of the present invention. In an embodiment of the present invention, the two-dimensional photonic crystal cavity desirably comprises a mixed-material cavity implemented in at least the photonic structure and the optically active material. This feature imparts the advantage of ease of implementation to an embodiment of the present invention since the cavity is not restricted to being formed in either the optically active material or the photonic structure. Furthermore, such an implementation may be suited for specific devices and/or applications and so may impart the advantage of versatility to an embodiment of the present invention. Alternatively, the two-dimensional cavity is preferably implemented substantially in the optically active material, which feature may be used to target specific devices and/or applications in respect of an embodiment of the present invention. With respect to the third coupling scheme, there is desirably provided at least a photonic crystal waveguide configurable to couple the light generated by the optically active material to at least a desired location, which feature may provide improved optical coupling of light generated by the optically active material to a desired location and so facilitate improved device performance of an embodiment of the present invention. In relation to an embodiment of the present invention comprising a two-dimensional photonic crystal cavity, the periodic holes are preferably substantially of the same-size, which feature has the associated advantage of ease of fabrication and/or implementation and so imparts such corresponding advantages to an embodiment of the present invention.

Desirably, and in relation to a fourth coupling scheme with a lateral cavity feature, an embodiment of the present invention comprises at least a circular grating of alternating layers of at least two materials, one of the materials having a lower refractive index than the other of the two materials. Such a lateral cavity design may offer azimuthal symmetry resulting in a band-gap for substantially all in-plane k-vectors. Furthermore, such a cavity design may facilitate higher quality factor values to be achieved, such as, for example, $10^6$. With respect to the fourth coupling scheme, the photonic structure preferably comprises a wire waveguide, which feature Advantages extends the advantages of ease of optically coupling light substantially laterally from the optically active material to the photonic structure, ease of fabrication and/or integration to an embodiment of the present invention. With respect to the fourth coupling scheme, desirably the photonic structure comprises at least a tapered region between the circular grating and a region thereof into which light generated by the optically active material is substantially coupled to. The taper feature may be used to advantage to match the respective modal sizes of a light source based on the optically active material and the optically passive aspect, for example, where the light source is a III-V material system and the optically passive aspect comprises a silicon optical waveguide. In this way, a modal gain of an embodiment of the present invention may be further improved.

A corresponding method aspect is also provided, and so according to an embodiment of a second aspect of the present invention, there is provided a method for fabricating a semiconductor device for use in at least an optical application comprising the steps of:
  forming a predefined structure in a crystalline seed layer, wherein the crystalline seed layer may be provided as a part of an optically passive aspect. The optically passive aspect may be operable in substantially an optically passive mode. The crystalline seed layer may comprise or may be a crystalline wafer. The method comprises the further step of:
  epitaxially growing an optically active material in the predefined structure, wherein the optically active material comprises or consists of at least one of: a III-V material and a II-VI material. The optically active material may be operable in substantially an optically active mode.

The method comprises the further step of:
  structuring the optically passive aspect to comprise at least a passive photonic structure.

According to a further embodiment of the method the structuring of the optically passive aspect to comprise the photonic structure is performed subsequently to the epitaxial growing of the optically active material in the predefined structure.

According to a further embodiment a cleaning step for removing the excess optically active material is provided. The excess optically active material may be any of the optically active material around the predefined structure and/or on the optically passive aspect. Removal of the excess optically active material may be done by wet-chemical etching, chemical mechanical polishing or any other suitable method for this purpose. The cleaning step is preferably performed before the step of structuring the passive aspect to comprise the passive photonic structure.

According to a further embodiment of the method t the predefined structure is formed to extend into the crystalline wafer.

According to a further embodiment of the method the predefined structure is formed with an aspect ratio, that is, the ratio of its height to its width/diameter, of greater than 1 and, more preferably, of greater than 3.

BRIEF DESCRIPTION OF THE DRAWINGS

Reference will now be made, by way of example, to the accompanying drawings, in which:

FIGS. 2a to 2d show top-views of an embodiment of the present invention corresponding to different stages of a process that may be used to fabricate an embodiment of the present invention;

DETAILED DESCRIPTION OF THE PREFERRED EMBODIMENTS OF THE PRESENT INVENTION

Figure 1A:
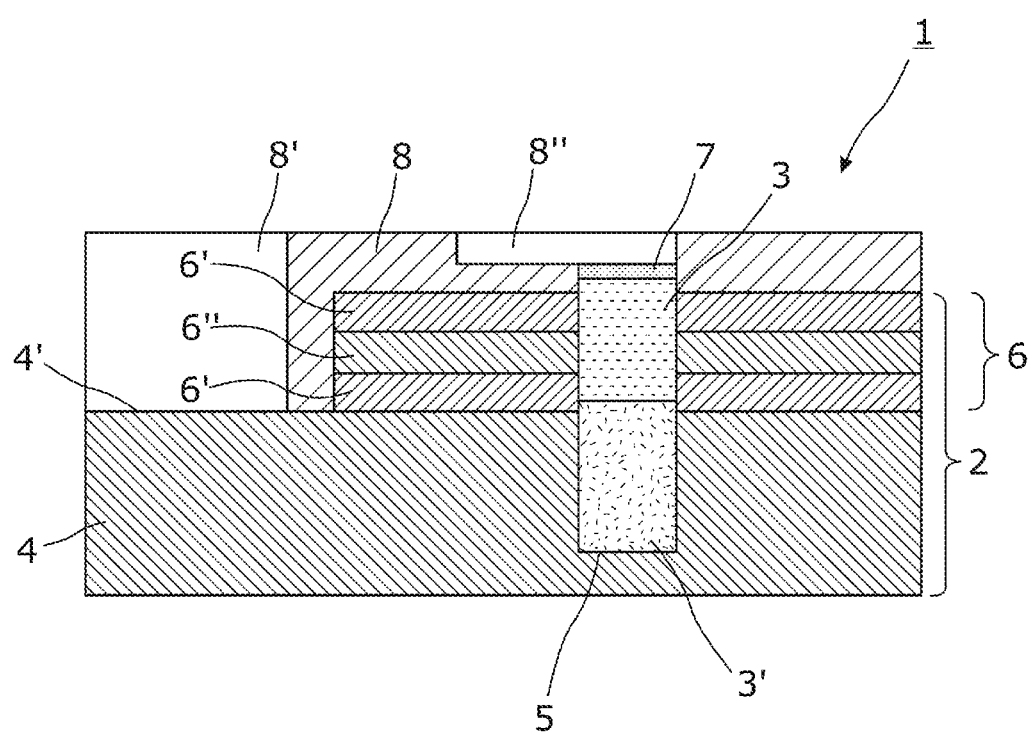
FIG. 1a shows a side-view of an embodiment of the present invention.

Within the description, the same reference numerals or signs have been used to denote the same parts or the like.

Reference is now made to FIG. 1a showing a semiconductor device 1 according to an embodiment of a first aspect of the present invention comprising at least an optically passive aspect or region 2 that, when the semiconductor device 1 is in use, is operable in substantially an optically passive mode for the transmission and/or coupling of light from a given location to a desired location, rather than for the generation, amplification, detection and/or modulation of light. The optically passive aspect 2 is structured thereby to comprise at least a predefined structure 5, which extends to at least an upper surface 4' of a crystalline seed layer 4 provided in respect of the optically passive aspect 2 or even into the crystalline seed layer 4 as for a given embodiment of the present invention as shown in FIG. 1*a*. There is also provided at least an optically active material 3 comprising at least a material that is operable in substantially an optically active mode and that is chosen on account of being suitable for light generation, amplification, detection and/or modulation. By optically active, it is meant that the optically active material 3 has a characteristic facilitating light emission and/or light amplification by providing an optical gain, making it suitable for light sources, such as lasers and light amplifiers such as semiconductor optical amplifiers, and/or a relatively high non-linearity, making it suitable for the fabrication of modulators, or having relatively high absorption properties for the fabrication of detectors. The optically active material 3 is grown in the predefined structure 5, after which the optically passive aspect 2 is structured to comprise at least a photonic structure 6. In this way, the optically active material 3 is optically coupled in at least a lateral plane with the optically passive aspect 2, particularly the features thereof such as the photonic structure 6.

In an embodiment of the present invention, the optically passive aspect 2 comprises a multilayer structure 6', 6" provided on an upper surface 4' of the crystalline seed layer 4. The photonic structure 6, comprising an optical waveguide in a preferred embodiment, is patterned in at least one of the layers 6" of the multilayer structure 6', 6". In this regard, the materials of the multilayer structure 6', 6" are selected to support optical coupling of the light generated by the optically active material 3 to the photonic structure 6 and also the wave-guiding properties of the photonic structure 6. In a preferred embodiment, the material composition of the multilayer structure 6', 6" is chosen such that one of the layers has a higher refractive index than another of the layers. Thus, by way of example, silicon may be selected for one of the layers 6" as a core layer and silicon dioxide for another of the layers 6' of the multilayer structure 6', 6" thereby to serve as a cladding layer, with the photonic structure 6 comprising an optical waveguide being patterned in the core silicon layer 6" of the multilayer structure 6', 6". In a preferred embodiment of the present invention, the multilayer structure 6', 6" comprises an upper cladding layer 6', a core layer 6" and a lower cladding layer 6' disposed adjacent to the upper surface 4' of the crystalline seed layer 4. Generally, the materials of the multilayer structure 6', 6" are chosen such that the predefined structure 5 comprises a dielectric aperture in which the optically active material 3 is grown. In this regard, the materials of the multilayer structure 6', 6" are chosen such that the dielectric aperture comprises at least one of: silicon, germanium, gallium arsenide, gallium antimonide, gallium nitride, indium phosphide, indium aluminium arsenide, indium arsenic phosphide, indium gallium phosphide, gallium phosphide, indium gallium arsenide, indium gallium arsenic phosphide, aluminium oxide, tantalum pent-oxide, hafnium dioxide, titanium dioxide, silicon dioxide, silicon nitride and silicon oxi-nitride. Of course, an embodiment of the present invention is not limited to the use of these materials for the multilayer structure 6', 6" and indeed any material(s) that may support the function(s) of the photonic structure 6 and/or the dielectric aperture as above-described may be used therefor. Alternatively, the predefined structure 5 may be an aperture comprising a blocking p-n junction. The materials for the blocking p-n junction being chosen so as to block the optically active material 3 and/or light source structure implemented by way of the optically active material 3.

In an embodiment of the present invention, the predefined structure 5 is preferably a trench, hole or a combination thereof. At least a structural characteristic of the predefined structure 5 such as a width, height and/or a shape thereof, may be selected thereby to facilitate a desired epitaxial growth and/or optical coupling of the optically active material 3 with respect to the optically passive aspect 2. In a preferred embodiment of the present invention, the aspect ratio of the predefined structure 5, that is, the ratio of its height to its width/diameter, is chosen to be greater than 1 and, more preferably, greater than 3. In an embodiment of the present invention, the aspect ratio is broadly chosen so as to facilitate aspect ratio trapping of the defects that are due to the lattice mismatch between the respective materials/material systems used for the optically active material 3 and the optically passive aspect 2. In a preferred embodiment of the present invention, the height of the predefined structure 5 is chosen to be 1000 nm and its width/diameter is chosen to be 250 nm. An embodiment of the present invention is, of course, not limited to the given examples of the aspect ratio, height and/or width dimensions for the predefined structure 5, and in fact any other sizes falling within the scope of the present invention may be used therefore.

In an embodiment of the present invention, the predefined structure 5 is provided in a given location of the optically passive aspect 2, which is structured after the optically active material 3 is grown in the predefined structure 5. In this regard, the optically passive aspect 2 is structured to comprise the multilayer structure 6', 6" as hereinbefore described, where in a preferred embodiment of the present invention, a lower cladding layer 6' of the multilayer structure 6', 6" is not patterned. In respect of the optical coupling of the optically active material 3 with the optically passive aspect 2, the optically active material 3 is grown locally in the predefined structure 5 rather than over the whole surface of the optically passive aspect 2. In this regard, the predefined structure 5 is formed in the optically passive aspect 2 where the integration of the laser/light source, by way of the optically active material 3, is anticipated.

Regarding the epitaxial growth of the optically active material 3 in the predefined structure 5, two methods are proposed in an embodiment of the present invention. In one method, selective epitaxial growth is done in which the optically active material 3 is substantially selectively grown in the predefined structure 5. In this regard, and in a preferred embodiment, an uppermost layer 6' of the multilayer structure 6', 6" is chosen to be an oxide layer. It performs the dual function of serving as a cladding layer for the photonic structure 6 being implemented as a waveguide and also as a mask for the selective growth of the optically active material 3 in the predefined structure 5 of the optically passive aspect 2. In another method, height selective epitaxial growth of the optically active material 3 is done in which it is grown relative to a surface of the optically passive aspect 2 in which the predefined structure 5 is formed so as to exceed at least an area of the predefined structure 5. Thus, the optically active material 3 is grown relative to the optically passive aspect 2 so as to at least be grown in and around the predefined structure 5. The excess optically active material 3, which may be any of the optically active material 3 around the predefined structure 5 and/or on the optically passive aspect 2, is removed so that the optically active material 3 is provided in the predefined structure 5. Removal of the excess optically active material 3 may be done by wet-chemical etching, chemical mechanical polishing or any other suitable method for this purpose.

Figure 1B:
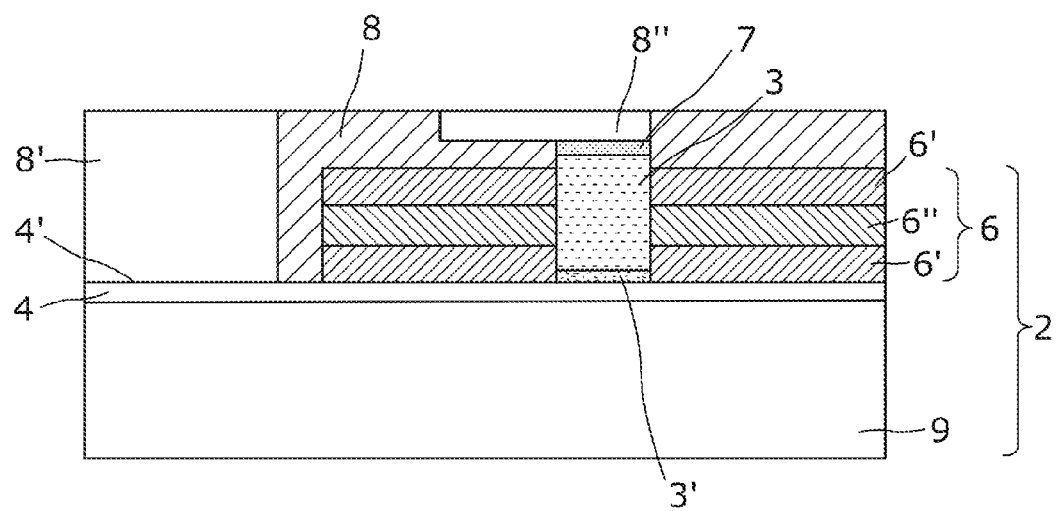
FIG. 1b shows a side-view of another embodiment of the present invention.

Regarding the crystalline seed layer 4, it provides a crystalline template for the epitaxial growth of the optically active material 3 in the predefined structure 5. This function is performed by the upper surface 4' of the crystalline seed layer 4, which in an embodiment of the present invention, is disposed adjacent to the multilayer structure 6', 6" of the optically passive aspect 2 and also follows a contour of the predefined structure 5. In an embodiment of the present invention, the crystalline seed layer 4 may comprise one of a crystalline wafer and a crystalline oxide layer. Where the crystalline seed layer 4 is selected to comprise a crystalline wafer 4, the predefined structure may be formed to at least an upper surface 4' of the crystalline wafer 4 or even extend into the crystalline wafer 4, the latter scenario being depicted by FIG. 1a. An embodiment of the present invention in which the crystalline seed layer 4 comprises a crystalline oxide layer is schematically illustrated by FIG. 1b. The crystalline oxide layer 4 may be provided on a handling substrate/wafer 9 as depicted by FIG. 1b and, in a preferred embodiment of the present invention, is selected to comprise strontium barium titanate. In an embodiment of the present invention, and as explained generally in respect of the crystalline seed layer 4, an upper surface 4' of the crystalline oxide layer 4 provides the information for the epitaxial growth of the optically active material 3 in the predefined structure 5. Alternatively, and for ease of implementation, the crystalline oxide layer 4 is merged with the lowest cladding layer 6' of the multilayer structure 6', 6" adjacent thereto thereby to provide the crystalline information for the growth of the optically active material 3 in the predefined structure 5. Generally, for the material composition of the crystalline seed layer 4, it may be selected to comprise at least one of: silicon, germanium, silicon-germanium, III-V compound semiconductor and crystalline oxides such as strontium barium titanate. Of course, an embodiment of the present invention is not limited to the use of such materials for the crystalline seed layer 4 and, indeed, any other appropriate materials that may facilitate the epitaxial growth of the optically active material 3 in the predefined structure 5 are considered to be encompassed within the scope of the present invention.

In an embodiment of the present invention, the optically active material 3 may be grown directly into the predefined structure 5 or, alternatively and as can be most clearly seen from FIG. 1a, it is grown on an intermediate/buffer layer 3' grown/provided in the predefined structure 5. The buffer layer 3' may be provided to address a lattice mismatch/strain which may exist between the constituent materials of the optically active material 3 and the crystalline seed layer 4. In this way, defects generated by strain relaxation may be confined to the buffer layer 3', rather than being propagated to the optically active material 3. A composition of the buffer layer 3' may be chosen thereby to comprise a material having a larger band-gap than that of the optically active material 3 so that it preferably does not absorb the light that is generated by the optically active material 3.

Regarding the implementation of the optically active material 3 for light generation in an embodiment of the present invention, this is done so that the light source based on the optically active material 3 is a light-emitting structure comprising one of at least: a laser, a light emitting diode, a super luminescent diode and a semiconductor optical amplifier. In this respect, a super-luminescent diode may be considered to be in an intermediate stage between a laser and a light-emitting diode. A semiconductor optical amplifier may be considered to be a laser without a cavity that amplifies an optical signal as desired without changing the original wavelength of the optical signal, which function may be attractive in certain applications/devices such as, for example, certain advanced receiver schemes. In this regard, the light emitting structure may be implemented by way of one of: a quantum dot laser and/or a light-emitting diode, a nanowire laser and/or a light-emitting diode, a quantum post laser and/or light emitting diode, a quantum well laser/light emitting diode and a single photon light source. Of course, an embodiment of the present invention is not restricted to any of the listed implementations of the optically active material 3 to facilitate the light source in an embodiment of the present invention and indeed any other appropriate implementation is encompassed within the scope of the present invention.

In an embodiment of the present invention, for the optically active material 3, a wide and diverse range of materials and/or material systems may be used, such as, for example, a III-V material system, a II-VI material system, at least a silicon nanoparticle, at least a silicon quantum dot, germanium and heterostructures thereof comprising at least one of: gallium arsenide, gallium antimonide, gallium nitride, indium phosphide, indium phosphide, indium aluminium arsenide, indium arsenic phosphide, indium gallium phosphide, gallium phosphide, indium gallium arsenide and indium gallium arsenic phosphide. For the optically active material 3, a crystalline material such as crystalline silicon, polycrystalline material such as polycrystalline silicon or amorphous material such as amorphous silicon, amorphous barium titanate, may be used in an embodiment of the present invention. The aforementioned materials/material systems have been given by way of example. An embodiment of the present invention is not limited to the use thereof and any other materials/material systems that may fall within the scope of the present invention for the optically active material 3 are considered to be included within the ambit of the present invention. Generally, for the optically active material 3, those materials/material systems having a band-gap characteristic such that they exhibit a relatively high non-linearity, that is, a relatively high optical gain and high absorption, suited for a given application defined by a given target wavelength, may be used in an embodiment of the present invention.

In an embodiment of the present invention, the optically active material 3 may be selected so as to have an emission wavelength that is substantially matched with a transmission range of the optically passive aspect 2, and particularly of the photonic structure 6 when implemented as an optical waveguide. By way of example, if the photonic structure 6 comprises a silicon waveguide, the optically active material 3 may be selected so as to have a transmission range larger than 1100 nm. In this regard, such a wavelength range may be obtained for the optically active material 3 being: InAs quantum dots capped with GaAs; (In, Ga)As, (In, Ga)(As, N, P) or (In, Ga)(As, N, Sb), (In, Ga)(As, N) quantum wells; InGaAsP quantum wells; InAsP quantum wells, other III-V or II-VI compound materials or germanium.

Regarding the further features of an embodiment of the present invention as shown in FIGS. 1a and 1b, a bottom contact 8' and top contact 8" are provided, which may provide electrical contacts for the light-emitting region/optically active material 3, thereby to drive an embodiment of the present invention. Insulating material 8 may be provided to electrically separate the bottom contact 8' and the top contact 8" from each other and may comprise silicon oxide or silicon nitride, for example.

Reference is now made to FIGS. 2a to 2d which show top-views of an embodiment of the present invention corresponding to different stages of a process that may be used to fabricate an embodiment of the present invention. As shown in FIG. 2a, a predefined structure 5 is formed with respect to the underlying crystalline seed layer 4 of the optically passive aspect 2. In the present example, and as can be seen from FIG. 2a, the predefined structure 5 is chosen to be a trench. As depicted by FIG. 2b, the optically active material 3 is epitaxially grown into the predefined structure 5. Subsequently, and as shown in FIG. 2c, the optically passive aspect 2 is structured thereby to comprise a photonic structure 6 with, as depicted by the arrows in FIG. 2c, an alignment tolerance in a longitudinal plane that may be, but is not limited to, a range of 100 nm to 5 µm, which extends the advantages of flexibility and ease of implementation to an embodiment of the present invention. Finally, and as shown in FIG. 2d, electrical contacts are provided to an embodiment of the present invention.

Generally, and with regard to an embodiment of the present invention, the light source may only be located in the optically active material 3 and exhibits optically or electrically pumped emission. While silicon does not exhibit sufficient photoluminescence efficiency due to its indirect band-gap, it offers relatively low-propagation loss and dispersion. Furthermore, it may be fabricated with well-established CMOS processes, which makes it attractive for use as wave-guiding material that may be integrated with ease and fabricated in a cost-effective manner. Thus, in a preferred embodiment, the optically active material 3 is based on a III-V based material system and the photonic structure 6 may be implemented by way of a silicon optical waveguide. In this regard, the optical coupling of light generated by the optically active material 3 to the passive photonic structure 6, specifically the core wave-guiding layer 6" thereof, or a desired location is done by different coupling schemes that are described hereinafter.

Figure 3A:
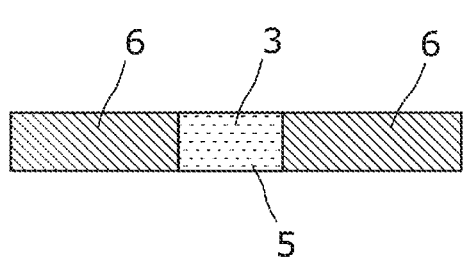
FIGS. 3a and 3b illustrate a first coupling scheme with a lateral cavity feature in an embodiment of the present invention.
Figure 3B:
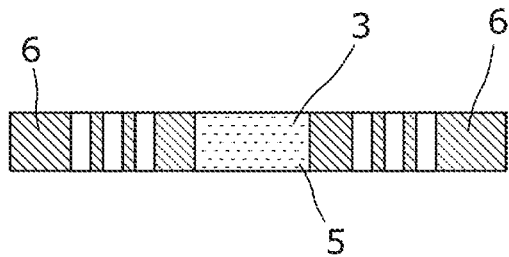

Reference is now made to FIGS. 3a and 3b which illustrate a first coupling scheme with a lateral cavity feature in an embodiment of the present invention. As shown in FIG. 3a, in an embodiment of the present invention, butt-coupling is used for substantially laterally coupling the light generated by the III-V based light source 3 to the silicon waveguide 6. In order to form a laser, a cavity is to be implemented in order that photons may travel the gain medium, thereby to generate stimulated emission. Accordingly, in an alternative embodiment of the first coupling scheme, the passive photonic structure 6 comprises a wire cavity implemented as a dielectric Bragg reflector as shown in FIG. 3b. In order to form a dielectric Bragg reflector, lower index material than silicon, such as, for example, air, is introduced periodically between the silicon of the passive photonic structure 6 as can be seen in FIG. 3b.

Figure 4:
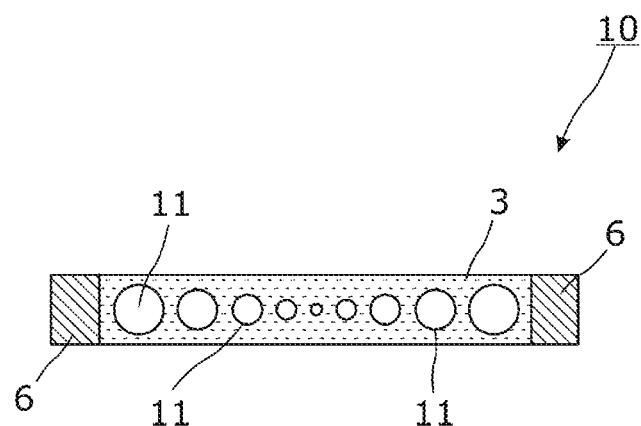
FIG. 4 illustrates a second coupling scheme with a lateral cavity feature in an embodiment of the present invention.

Reference is now made to FIG. 4 which illustrates a second coupling scheme with a lateral cavity feature in an embodiment of the present invention. The second coupling scheme is based on a one-dimensional photonic crystal cavity 10 in which periodic holes 11 are formed in an in-plane direction of the photonic structure 6 and in a region thereof where light generated by the III-V based light source 3 is substantially coupled to the photonic structure 6. The use of relatively high-reflective materials such as silicon and III-V materials facilitates vertical and in-plane confinement by way of index-guiding. In one example of the second coupling scheme according to an embodiment of the present invention, and as shown in FIG. 4, the one-dimensional photonic crystal cavity 10 is implemented by forming the periodic holes 11 within the III-V material and the silicon material is used substantially for guiding the light generated by the III-V based light source 3 to a desired location. As can be seen from FIG. 4, the periodic holes 11 may be implemented as progressively increasing to a given size in a direction towards the silicon material forming the basis of the passive photonic structure 6. The progressively tapered holes extend the advantages of mode-shaping of the cavity mode and higher quality-factor values to an embodiment of the present invention as shown in FIG. 4.

Figure 5A:
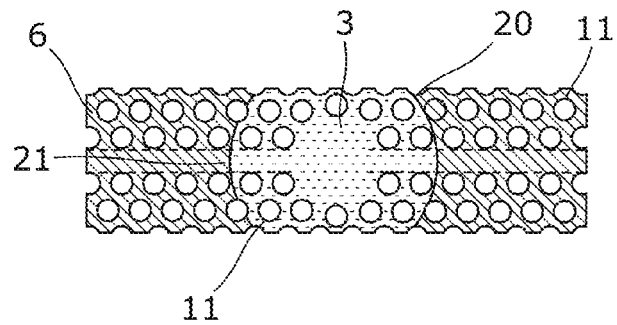
FIGS. 5a to 5c illustrates a third coupling scheme with a lateral cavity feature in an embodiment of the present invention.
Figure 5B:
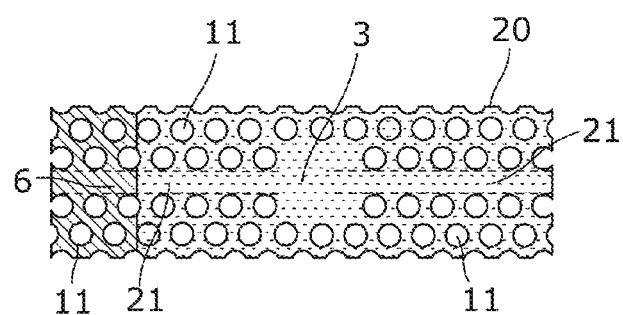
Figure 5C:
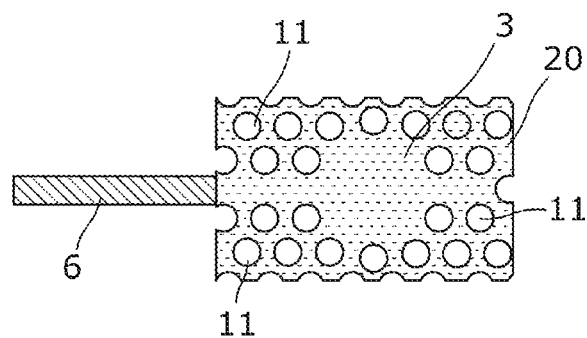

Reference is now made to FIGS. 5a to 5c which illustrate a third coupling scheme with a lateral cavity feature in an embodiment of the present invention, the basis of which is a two-dimensional photonic crystal cavity 20 in which periodic holes 11 of substantially the same size are formed in two in-plane directions of the photonic structure 6. The periodic holes 11 perform as reflectors. Within the two-dimensional photonic cavity 20, there is a defect in which the light generated by the III-V based light source 3 is confined and the position of the defect corresponds to where the III-V based light source 3 is located. In this regard, the two-dimensional photonic crystal cavity 20 may be implemented as a mixed material cavity, that is, by way of a defect that may be formed partially in the III-V material of the III-V based light source 3 and partially in the silicon material provided in respect of the optically passive aspect 2 as shown in FIG. 5a. Alternatively, the two-dimensional photonic crystal cavity 20 may be implemented entirely in the III-V material of the III-V based light source 3 as shown in FIGS. 5b and 5c. With respect to the coupling of light that is generated by the III-V based light source 3, it remains confined to the defect and is respectively coupled to a desired location or passive photonic structure 6 by way of a photonic crystal waveguide 21 in the scenarios of FIGS. 5a and 5b and by a conventional silicon waveguide 6 comprising a core silicon layer 6" and a lower refractive index cladding layer 6' in the scenario of FIG. 5c.

Figure 6A:
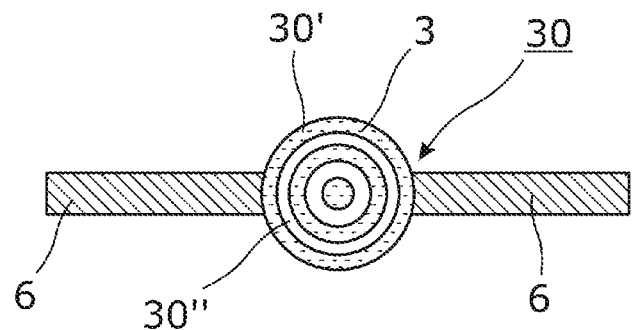
FIGS. 6a and 6b illustrates a fourth coupling scheme with a lateral cavity feature in an embodiment of the present invention.
Figure 6B:
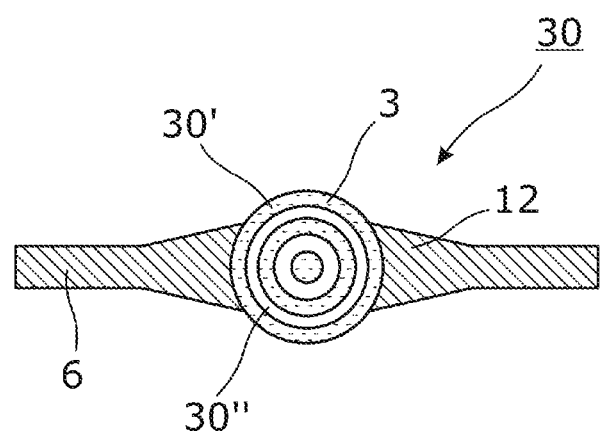

In an alternative implementation of the lateral cavity feature, there is provided a fourth coupling scheme as shown in FIGS. 6a and 6b. In this regard, the passive photonic structure 6 is implemented as a wire waveguide 6" and there is provided a circular grating 30 formed of alternating layers/cavity mirrors 30', 30" of at least two materials, one of the materials having a lower refractive index than the other of the two materials, examples of such materials being silicon oxide and silicon nitride. In this regard, and as shown in FIGS. 6a and 6b, the alternating layers/cavity mirrors 30', 30" may be fabricated in a location corresponding to that of the III-V material forming the basis of the III-V based light source 3 with the silicon waveguide 6 substantially solely performing a wave-guiding function thereby to couple light generated by the III-V based light source 3 to a desired location. The example of a lateral cavity feature according to a fourth coupling scheme as shown in FIG. 6b comprises a further modification to that shown in FIG. 6a in that the silicon waveguide 6 comprises a tapered region 12 that may facilitate matching of the respective cavity modes and the waveguide mode.

Figure 7A:
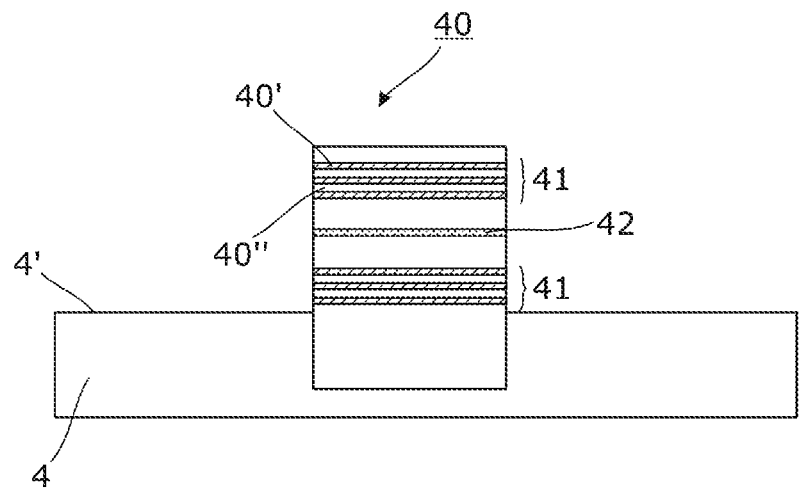
FIGS. 7a and 7b illustrate a coupling scheme with a vertical cavity feature.
Figure 7B:
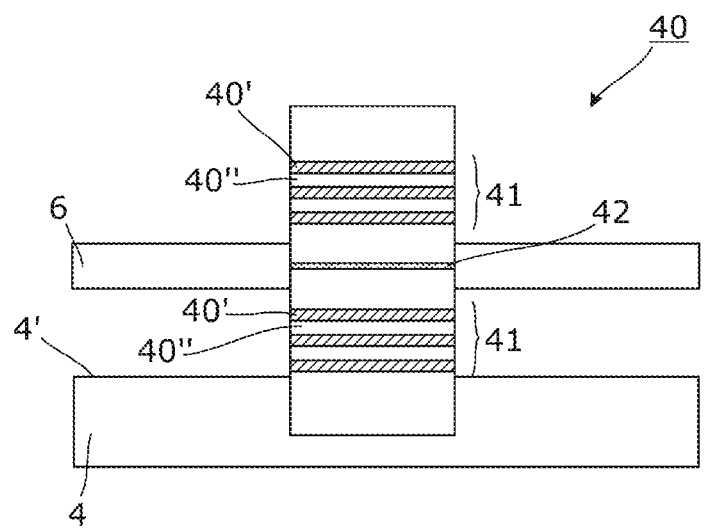

Reference is now made to FIGS. 7a and 7b, which illustrate a coupling scheme in an embodiment of the present invention that is based on a vertical cavity feature 40, which is implemented by way of a vertical-cavity, light-emitting structure such as a vertical-cavity surface-emitting laser VCSEL. The VCSEL 40 comprises alternating layers 40',

40″ of the III-V material, which form the dielectric Bragg reflectors/mirrors 41. The stacked multiple layers 40′, 40″ have alternating refractive indices, thus facilitating a Bragg reflector 41 having close to unity reflection. This facilitates relatively low-threshold, high-power vertically-emitting lasers and/or light-emitting diodes to be produced in an embodiment of the present invention. Generally, the vertical-cavity, surface-emitting laser 40 is formed relative to the upper surface 4′ of the crystalline seed layer 4 as shown in FIGS. 1a and 1b.

FIG. 7a shows an embodiment of the present invention where an emission region 42 of the vertical-cavity, surface-emitting laser 40 is such that the light it generates is coupled in substantially a vertical plane relative to the optically passive aspect 2, particularly a surface of the photonic structure 6. FIG. 7b shows an embodiment of the present invention in which at least an emission region 42 of the vertical-cavity, surface-emitting laser is such that the light it generates is coupled substantially laterally in an in-plane direction of the optically passive aspect 2, particularly the photonic structure 6. An advantage associated with an embodiment of the present invention as shown in FIG. 7b is that top and bottom mirrors 41′ are facilitated. In contrast, only a top mirror 41′ is facilitated in an embodiment of the present invention as shown in FIG. 7a.

The respective vertical cavity designs shown in FIGS. 7a and 7b may be implemented in isolation or in combination with any one of the lateral cavity features described hereinabove with reference to FIGS. 3 to 6. Furthermore, the mirrors/reflectors in FIGS. 7a and 7b may be implemented by way of high contrast gratings rather than dielectric Bragg mirrors, which may facilitate more compact structures to be facilitated. The growth position of the III-V material/optically active material 3 is determined by the position of the predefined structure 5, which defines the access point of the gaseous and molecular precursors during metal organic chemical vapour deposition and molecular beam epitaxial growth, respectively.

Regarding optically coupling the III-V based light source 3 to the photonic structure 6/waveguide core 6″/waveguide cladding 6′/a desired location, hybrid structures with III-V/silicon mixed resonators and/or three-dimensional cavities may be contemplated within the scope of an embodiment of the present invention.

The present invention has been described purely by way of example and modifications of detail may be made within the scope of the invention.

Each feature disclosed in the description, and where appropriate, the claims and the drawings, may be provided independently or in any appropriate combination.

The invention claimed is:

1. A semiconductor device (1) for use in at least an optical application comprising: at least an optically passive aspect (2) that is operable in substantially an optically passive mode, and at least an optically active material (3) comprising at least a material that is operable in substantially an optically active mode, wherein: the optically passive aspect (2) further comprises at least a crystalline seed layer (4), the optically active material (3) being epitaxially grown in at least a predefined structure (5) provided in the optically passive aspect (2) that extends into the crystalline seed layer (4) to at least an upper surface (4′) of the crystalline seed layer (4), and the optically passive aspect (2) is structured to comprise at least a passive photonic structure (6), wherein the crystalline seed layer (4) comprises a crystalline wafer and wherein the optically active material (3) comprises at least one of: a III-V material and a II-VI material.

2. A semiconductor device (1) as claimed in claim 1, wherein the optically passive aspect (2) is structured to comprise the passive photonic structure subsequent to the growth of the optically active material (3) in the predefined structure (5).

3. A semiconductor device (1) as claimed in claim 1, wherein the predefined structure (5) comprises a dielectric aperture (6′, 6″) formed with respect to the optically passive aspect (2), the optically passive aspect (2) being structured after the growth of the optically active material in the predefined structure (5).

4. A semiconductor device (1) as claimed in claim 3 wherein the dielectric aperture (6′, 6″) comprises at least one of: silicon, germanium, gallium arsenide, gallium antimonide, gallium nitride, indium phosphide, indium aluminium arsenide, indium arsenic phosphide, indium gallium phosphide, gallium phosphide, indium gallium arsenide, indium gallium arsenic phosphide, aluminium oxide, tantalum pent-oxide, hafnium dioxide, titanium dioxide, silicon dioxide, silicon nitride and silicon oxi-nitride.

5. A semiconductor device (1) as claimed in claim 1, wherein the aspect ratio of the predefined structure (5), that is, the ratio of its height to its width/diameter, is greater than 1 and, more preferably, greater than 3.

6. A semiconductor device (1) as claimed in claim 1, wherein the optically active material (3) is implemented as a light emitting structure comprising one of at least: a laser, a light emitting diode, a super luminescent diode and a semiconductor optical amplifier.

7. A semiconductor device (1) as claimed in claim 1 wherein the predefined structure (5) is a trench, a hole or a combination thereof.

8. A semiconductor device (1) as claimed in claim 1 wherein at least a structural characteristic of the predefined structure (5) is chosen thereby to foster a desired epitaxial growth of the optically active material (3).

9. A semiconductor device (1) as claimed in claim 1 wherein the predefined structure (5) is provided in a given location of the optically passive aspect (2).

10. A semiconductor device (1) as claimed in claim 1 wherein the optically active material (3) comprises a crystalline, polycrystalline or amorphous material.

11. A semiconductor device (1) as claimed in claim 1 wherein the photonic structure (6) comprises at least an optical waveguide (6″).

12. A semiconductor device (1) as claimed in claim 1 wherein the optically active material (3) has an emission wavelength that is substantially matched with a transmission range of the photonic structure (6).

13. A semiconductor device (1) as claimed in claim 12 wherein the crystalline seed layer (4) comprises at least one of: silicon, germanium, silicon-germanium, III-V compound semiconductor, a crystalline oxide and strontium barium titanate.

14. A semiconductor device (1) as claimed in claim 1 comprising at least a vertical-cavity surface-emitting laser (40) implemented by way of alternating layers (40′, 40″) of the optically active material (3).

15. A semiconductor device (1) as claimed in claim 14 wherein an emission region (42) of the vertical-cavity surface-emitting laser (40) is positioned relative to the optically passive aspect (2) such that light generated by the vertical-cavity surface-emitting laser (40) is coupled substantially in at least one of: a vertical plane relative to a surface of the optically passive aspect (2) and laterally in an in-plane direction of the optically passive aspect (2).

16. A semiconductor device (1) as claimed in claim 1 wherein light generated by the optically active material (3) is optically coupled into the photonic structure (6) by butt coupling.

17. A semiconductor device (1) as claimed in claim 1 wherein the photonic structure (6) comprises a wire cavity implemented as a dielectric Bragg reflector.

18. A semiconductor device (1) as claimed in claim 1 comprising at least a one-dimensional photonic crystal cavity (10) in which holes (11) are formed in in an in-plane direction of the photonic structure (6) and in a region thereof where light generated by the optically active material (3) is substantially optically coupled to the photonic structure (6).

19. A semiconductor device (1) as claimed in claim 18 wherein a hole-size of the holes (11) is tapered to progressively increase in at least a direction towards the photonic structure (6).

20. A semiconductor device (1) as claimed in claim 1 comprising at least a two-dimensional photonic crystal cavity (20) in which periodic holes (11) are formed in two in-plane directions of the photonic structure (6).

21. A semiconductor device (1) as claimed in claim 20 wherein the two-dimensional photonic crystal cavity (20) comprises a mixed-material cavity implemented in at least the photonic structure (6) and the optically active material (3).

22. A semiconductor device (1) as claimed in claim 20 comprising at least a photonic crystal waveguide (21) configurable to couple the light generated by the optically active material (3) to at least a desired location.

23. A semiconductor device (1) as claimed in claim 20 wherein the periodic holes (11) are substantially of the same-size.

24. A semiconductor device (1) as claimed in claim 1 comprising at least a circular grating (30) of alternating layers (30', 30") of at least two materials, one of the materials having a lower refractive index than the other of the two materials.

25. A semiconductor device (1) as claimed in claim 24 wherein the photonic structure (6) comprises a wire waveguide (6").

26. A semiconductor device (1) as claimed in claim 24 wherein the photonic structure (6) comprises at least a tapered region (12) between the circular grating (30) and a region thereof into which light generated by the optically active material (3) is substantially coupled to.

27. A method for fabricating a semiconductor device (1) for use in at least an optical application comprising:
  forming a predefined structure (5) in a crystalline seed layer (4), wherein the crystalline seed layer (4) is provided as a part of an optically passive aspect (2) and wherein the predefined structure is formed to extend into the crystalline seed layer (4), the optically passive aspect (2) being operable in substantially an optically passive mode, wherein the crystalline seed layer (4) comprises a crystalline wafer,
  epitaxially growing an optically active material in the predefined structure (5), the optically active material comprising at least one of: a III-V material and a II-VI material, the optically active material being operable in substantially an optically active mode,
  structuring the optically passive aspect (2) to comprise at least a passive photonic structure (6).

28. A method according to claim 27, wherein the optically passive aspect (2) is structured to comprise the passive photonic structure subsequently to the epitaxial growing of the optically active material in the predefined structure (5).

29. A method according to claim 27, wherein the predefined structure (5) is formed with an aspect ratio, that is, the ratio of its height to its width/diameter, of greater than 1 and, more preferably, of greater than 3.

30. A method according to claim 27, further comprising a cleaning step for removing the excess optically active material, wherein the cleaning step is performed before the step of structuring the passive aspect to comprise the passive photonic structure.

* * * * *